United States Patent
Wallace et al.

(10) Patent No.: US 10,197,603 B2
(45) Date of Patent: Feb. 5, 2019

(54) OPTICAL CURRENT TRANSDUCER WITH OFFSET CANCELLATION AND CURRENT LINEARIZATION

(71) Applicant: General Electric Company, Schenectady, NY (US)

(72) Inventors: Daniel Robert Wallace, Atlanta, GA (US); Daniel Korot, Atlanta, GA (US); Charles Max Serradimigni, Atlanta, GA (US)

(73) Assignee: General Electric Company, Schenectady, NY (US)

( * ) Notice: Subject to any disclaimer, the term of this patent is extended or adjusted under 35 U.S.C. 154(b) by 401 days.

(21) Appl. No.: 14/676,427

(22) Filed: Apr. 1, 2015

(65) Prior Publication Data

US 2016/0291062 A1 Oct. 6, 2016

(51) Int. Cl.
| | | |
|---|---|---|
| *G01R 15/24* | (2006.01) | |
| *G01R 19/32* | (2006.01) | |
| *G01R 15/00* | (2006.01) | |
| *G01R 19/00* | (2006.01) | |
| *G01R 19/25* | (2006.01) | |

(52) U.S. Cl.
CPC .......... *G01R 15/24* (2013.01); *G01R 15/005* (2013.01); *G01R 15/246* (2013.01); *G01R 15/247* (2013.01); *G01R 19/0092* (2013.01); *G01R 19/32* (2013.01); *G01R 19/2506* (2013.01)

(58) Field of Classification Search
CPC .... G01R 15/24; G01R 15/005; G01R 15/246; G01R 15/247; G01R 19/0092; G01R 19/32; G01R 19/2506

USPC ........................................................... 324/96
See application file for complete search history.

(56) References Cited

U.S. PATENT DOCUMENTS

| | | | | |
|---|---|---|---|---|
| 5,847,560 | A * | 12/1998 | Bosselmann | G01R 15/246 324/117 R |
| 7,038,786 | B2 * | 5/2006 | Blake | G01D 5/35303 356/483 |
| 7,655,900 | B2 | 2/2010 | Kurosawa et al. | |
| 7,786,719 | B2 | 8/2010 | Kurosawa et al. | |
| 2001/0033530 | A1 * | 10/2001 | Shibuya | G11B 7/0903 369/44.37 |
| 2004/0246460 | A1 * | 12/2004 | Auracher | H01S 5/06832 356/4.01 |

* cited by examiner

*Primary Examiner* — Patrick Assouad
*Assistant Examiner* — Khristopher Yodichkas
(74) *Attorney, Agent, or Firm* — Parks IP Law LLC

(57) ABSTRACT

There is provided a system for use with a fiber-optic current transducer. The system includes a processing unit configured to transduce a first light signal into a first electrical signal. The processing unit is further configured to transduce a second light signal into a second electrical signal. The processing unit is configured to remove offsets from the first electrical signal and the second electrical signal by forcing the first electrical signal and the second electrical signal to be on the same per unit basis. Furthermore, the processing unit is configured to combine the first electrical signal and the second electrical signal to produce a composite signal, the composite signal being free of the offsets. And the processing unit is further configured to linearize the composite signal to produce an output current indicative of a current flowing in a conductor disposed proximate the FOCT.

7 Claims, 5 Drawing Sheets

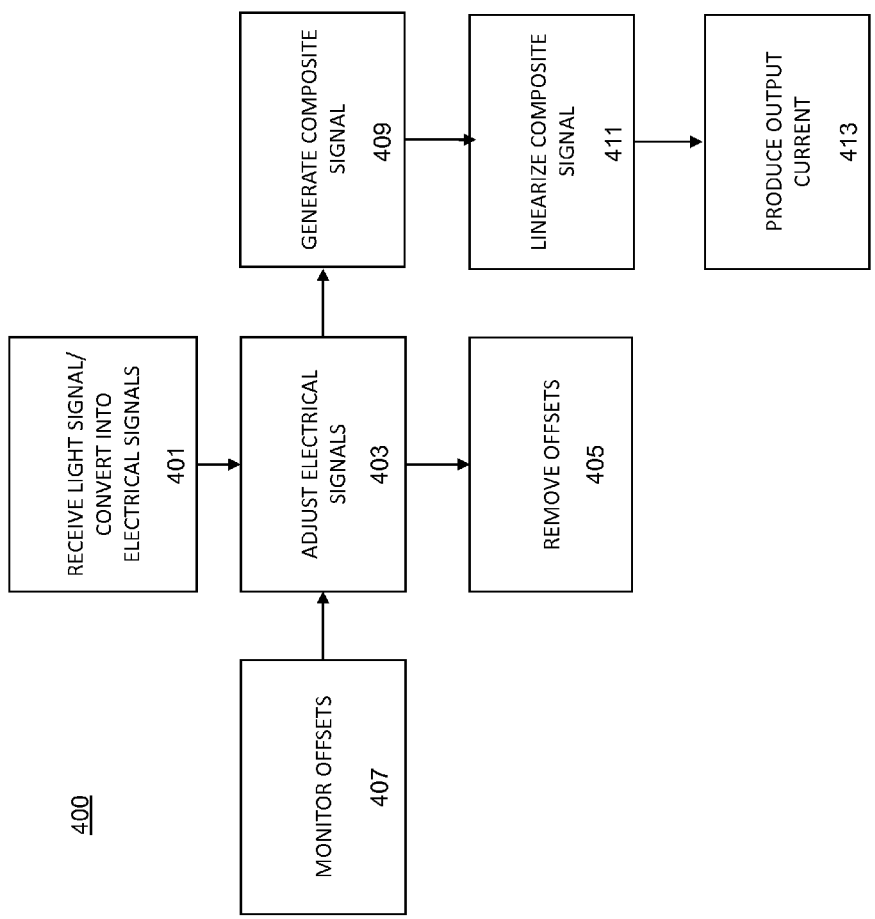

OPTICAL CURRENT TRANSDUCER WITH OFFSET CANCELLATION AND CURRENT LINEARIZATION

I. FIELD OF THE INVENTION

The present disclosure generally relates to optical current transducers. More particularly, the present disclosure relates to optical current transducers with offset cancellation.

II. BACKGROUND OF THE INVENTION

High voltage transmission lines require permanent current or voltage monitoring in order to mitigate faults. Specifically, the ability to quickly and reliably detect current transients is paramount because protection circuits must react in adequate time to isolate or remove short circuits that can damage equipment located at either end of a transmission line.

In some applications, large current transients can be measured using traditional iron core current transformers. Such transformers include costly ceramic insulators that are used to provide adequate isolation between the transformers' windings. As such, iron core transformers may not be an economical solution when considering deployment in large electricity distribution networks. Most importantly, however, these transformers have undesired performance characteristics. Namely, they can introduce significant distortions in the measured current signal due to the hysteresis of their iron cores.

Fiber-optic current transducers (FOCTs) have been used as an alternative technology to circumvent the aforementioned issues; FOCTs are less costly (when applied to high-voltage lines), and they have superior performance. They operate on the principle of Faraday rotation, which is a magneto-optical effect whereby a rotation of the plane of polarization of a light beam confined in a fiber-optic waveguide placed near the transmission line is observed in response to a magnetic field induced by the occurrence of the large current transient. The rotation angle is linearly proportional to the component of the magnetic field in the direction of propagation of the light, and as such, the change in angle can be correlated with the strength of the magnetic field, which can in turn be used to calculate the current.

A typical reflection-based FOCT measurement system includes a module of optical components with three fibers attached thereto. Two of the fibers (data fibers) are connected to a receiver, and the third fiber is a low birefringence fiber (LBF) that is wrapped around the transmission line or conductor.

Inside the module, there is a polarizer that polarizes the light at zero degrees. After the light is polarized, it is rotated by 22.5 degrees using a Faraday rotator. From the rotator, the light enters the LBF wherein it is further rotated by the magnetic field induced by the current in the transmission line. At the end of the LBF, there is a mirror that reflects the light back to the rotator, which rotates the light another 22.5 degrees. After the second rotation, the light is broken into two components that are transduced by the receiver into two electrical signals denoted "X" and "Y."

The Faraday rotator may cause significant errors in the X and Y components. These errors are manifested as DC offsets in each of the signals, and they are due to variations in temperature at the crystal that make up the Faraday rotator. As such, these offsets are termed "crystal offsets." Offsets may also arise from losses that occur when light travels through the data fibers. All of these offsets can introduce significant errors in estimating the current in the transmission line.

Furthermore, in typical FOCTs, at large current regimes (i.e. at currents greater than 4,000 A (rms)), the measured current typically exhibits a high degree of non-linearity, which leads to inaccurate estimations of the current in the transmission line. Furthermore, typical FOCTs cannot track sudden changes that occur in the current in the transmission line because they make use of slow analog components to process the X and Y signals. As such, conventional FOCTs also produce erroneous measurements in these situations.

III. SUMMARY

FOCTs configured according to embodiments of the present disclosure have several advantages that help mitigate several shortcomings known in the relevant art(s). For example, embodiments of the present disclosure allow offsets due to temperature variations to be removed from the measured signal and thus provide a more accurate output than what is possible with conventional FOCTs. Furthermore, FOCTs configured according to the teachings featured herein have the advantage of removing non-symmetrical features in the measured current waveform, thus making it possible to provide accurate information when processing the current using Fourier Transform techniques, for example. Specifically, FOCTs configured according to the present embodiments can linearize the measured current waveform, thus making it possible to measure currents up to the maximum current rating of the LBF (i.e. currents up to 35,000 A (rms)) with a high degree of fidelity. These advantages, and others that will be readily apparent to one of skill in the relevant art(s), are provided by the novel embodiments disclosed herein.

In one embodiment, the present disclosure features a system for use with a fiber-optic current transducer. The system includes a processing unit configured to transduce a first light signal into a first electrical signal. The processing unit is also configured to transduce a second light signal into a second electrical signal. Further, the processing unit is configured to remove offsets from the first electrical signal and the second electrical signal by forcing the first electrical signal and the second electrical signal to be on the same per unit basis. Furthermore, the processing unit is configured to combine the first electrical signal and the second electrical signal to produce a composite signal, the composite signal being free of the offsets. And the processing unit is further configured to linearize the composite signal to produce an output current indicative of a current flowing in a conductor disposed proximate the FOCT.

In another embodiment, the present disclosure provides a system for use with a fiber-optic current transducer. The system includes a processing unit configured to transduce a first light signal into a first electrical signal and a second light signal into a second electrical signal. The processing unit can include regulation circuitry configured to normalize the first electrical signal and the second electrical and to remove offsets in the first electrical signal and the second electrical upon normalization. Furthermore, the processing unit is configured to combine the first electrical signal and the second electrical signal to produce a composite signal, the composite signal being free of the offsets. And the processing unit is further configured to linearize the composite signal to produce an output current indicative of a current flowing in a conductor disposed proximate the FOCT.

Yet in another embodiment, the present disclosure features a method that includes adjusting, by a system, a first electrical signal and a second electrical signal until both electrical signals are on the same per unit basis. The method further includes removing, by the system, offsets present in each of the adjusted first electrical signal and second electrical signal. The method includes combining the first electrical signal and the second electrical signal to yield a composite signal, the composite signal being free of the offset. Moreover, the method includes linearizing the composite signal to yield an output current indicative of a current flowing in a conductor disposed proximate the FOCT.

Additional features and advantages, as well as the structure and operation of various embodiments, are described in detail below with reference to the accompanying drawings. It is noted that the disclosure is not limited to the specific embodiments described herein. Such embodiments are presented for illustrative purposes only. Additional embodiments will be apparent to persons skilled in the relevant art(s) based on the teachings contained herein.

IV. BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various figures. The drawings are only for purposes of illustrating embodiments and are not to be construed as limiting the disclosure. Given the following enabling description of the drawings, the novel aspects of the present disclosure should become evident to a person of ordinary skill in the art.

FIG. 4 is a flow chart depicting a method for removing offsets, according to an exemplary embodiment.

V. DETAILED DESCRIPTION OF EMBODIMENTS OF THE PRESENT INVENTION

While illustrative embodiments are described herein for particular applications, it should be understood that the present disclosure is not limited thereto. Those skilled in the art with access to the teachings provided herein will recognize additional modifications, applications, and embodiments within the scope thereof and additional fields in which the present disclosure would be of significant utility.

Figure 1:
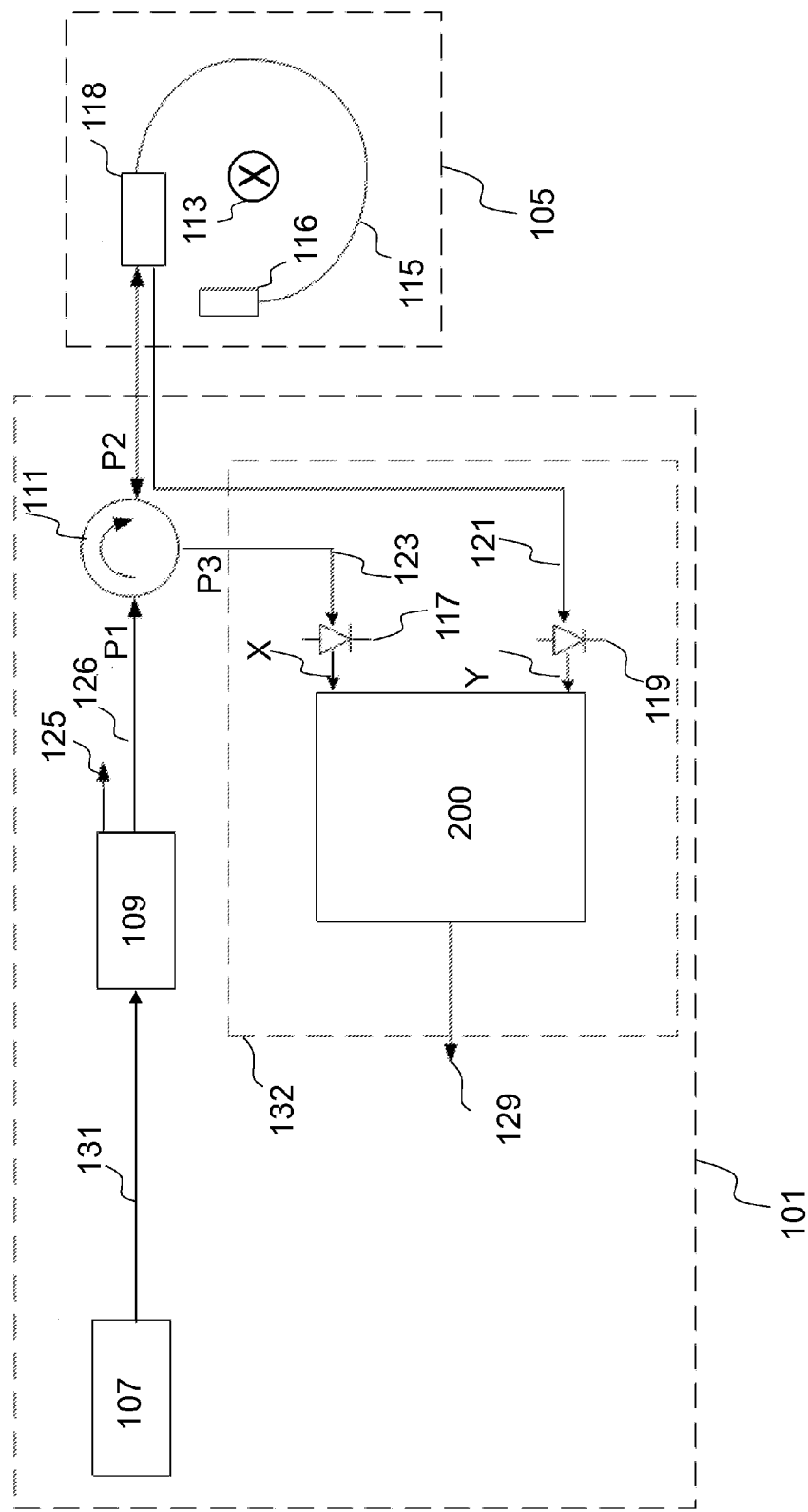
FIG. 1 is an illustration of a fiber-optic current transducer system configuration, according to an exemplary embodiment.

FIG. 1 is an illustration of a fiber-optic current system 100 transducer according to an exemplary embodiment. The FOCT includes a sensor module 105 and a receiver/decoder module 101. The sensor module 105 includes a fiber 115 positioned around conductor 113. The receiver module 101 includes a light source 107 that produces a non-polarized light beam 131 for input to an optical splitter 109. The optical splitter 109 is configured to split the light beam 131 into multiple outputs, of which only two are shown (125 and 126).

Output 126 is fed to an optical circulator 111 that allows light to enter a first port (P1) and to exit through a second port (P2). Light returning to the second port (P2) of optical circulator 111 is directed to a third port (P3) of optical splitter 109 of the fiber optic sensor 105 via optical module 118. Light beam 131 is coupled to fiber 115 and serves as a probe light beam that changes polarization when current flows in conductor 113. The light in fiber 115 is reflected back into the fiber using an end mirror 116 and back to the receiver 101 via path 123 and path 121. Paths 123 and 121 can be implemented using optical fibers or numerous other wave guiding devices known in the art.

As stated above, the light in fiber 115 is reflected back to receiver 101. A processing unit 132 included in receiver 101 is configured to process the reflected light to provide (at terminal 129) a measure of the current in conductor 113. Processing unit 132 includes transducers 117 and 119. These transducers are configured to convert the light beams from path 123 and path 121 into electrical signals X and Y, respectively.

Transducers 117 and 119 can be implemented using PIN diodes. By way of example, and not by limitation, each PIN diode may have a responsivity in the range of about 0.1 [Ampere/Watt] ([A/W]) to about 1 [A/W]. The transducers can also be implemented using other types of photodetector configurations. For example, p-n junctions, photogates, active or passive pixel sensors can be used to implement each of transducer 117 and 119. In general, any phototransducer can be used without departing from the scope contemplated in the present disclosure.

Processing unit 132 includes a system 200 configured to process electrical signals X and Y to produce an output signal at terminal 129, the output signal being indicative of the current in conductor 113. While only terminal 129 is shown in FIG. 1 as an output of processing unit 132 (and of system 200), other output terminals may be present. This may be a digital value stored in memory or an analog value from a D/A converter. Furthermore, while transducers 117 and 119 are shown to be separate from system 200, in some implementations, these transducers can be part of system 200.

Figure 2A:
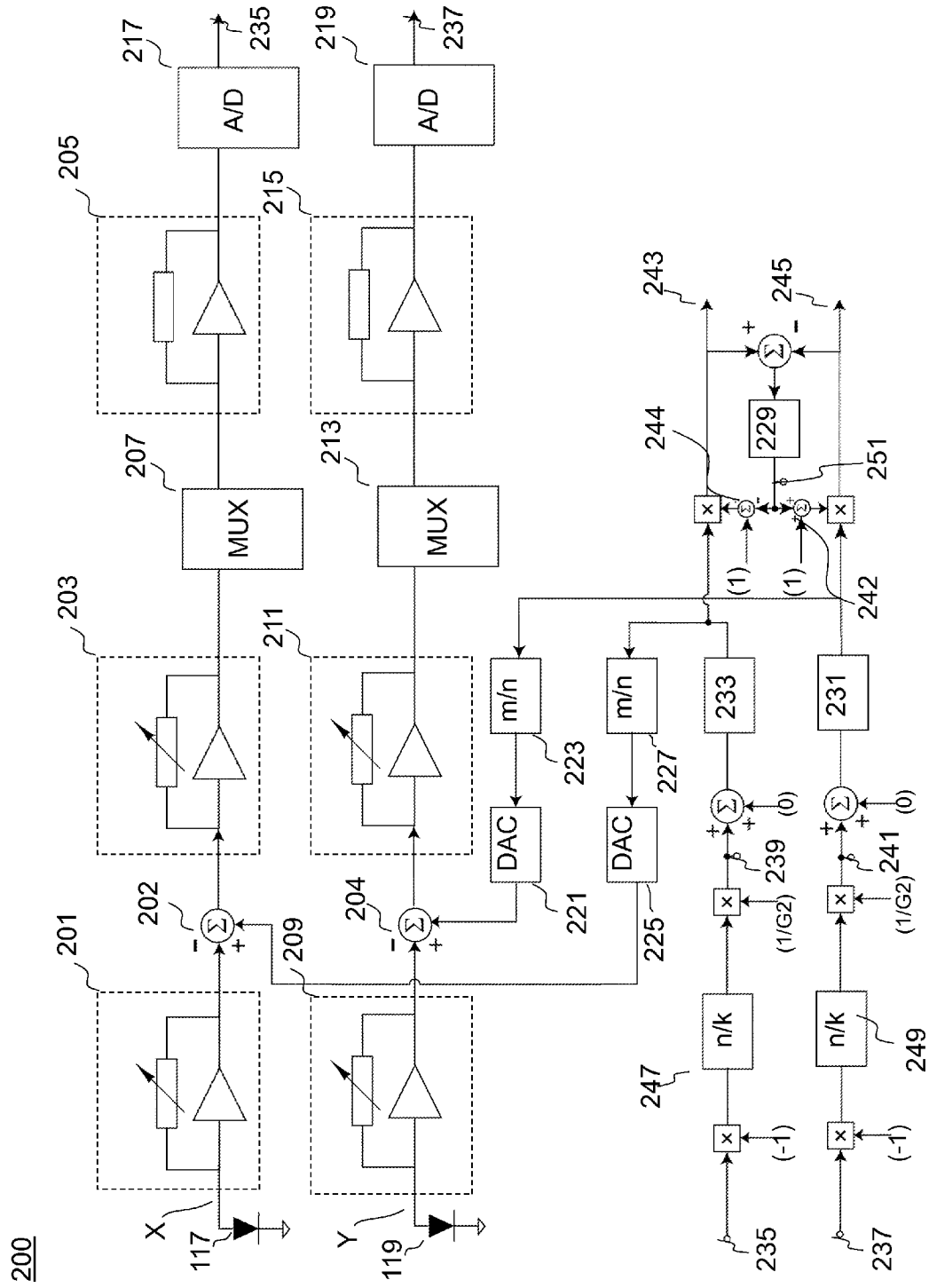
FIG. 2A is an illustration of a receiver or decoder system, according to an exemplary embodiment.
Figure 2B:
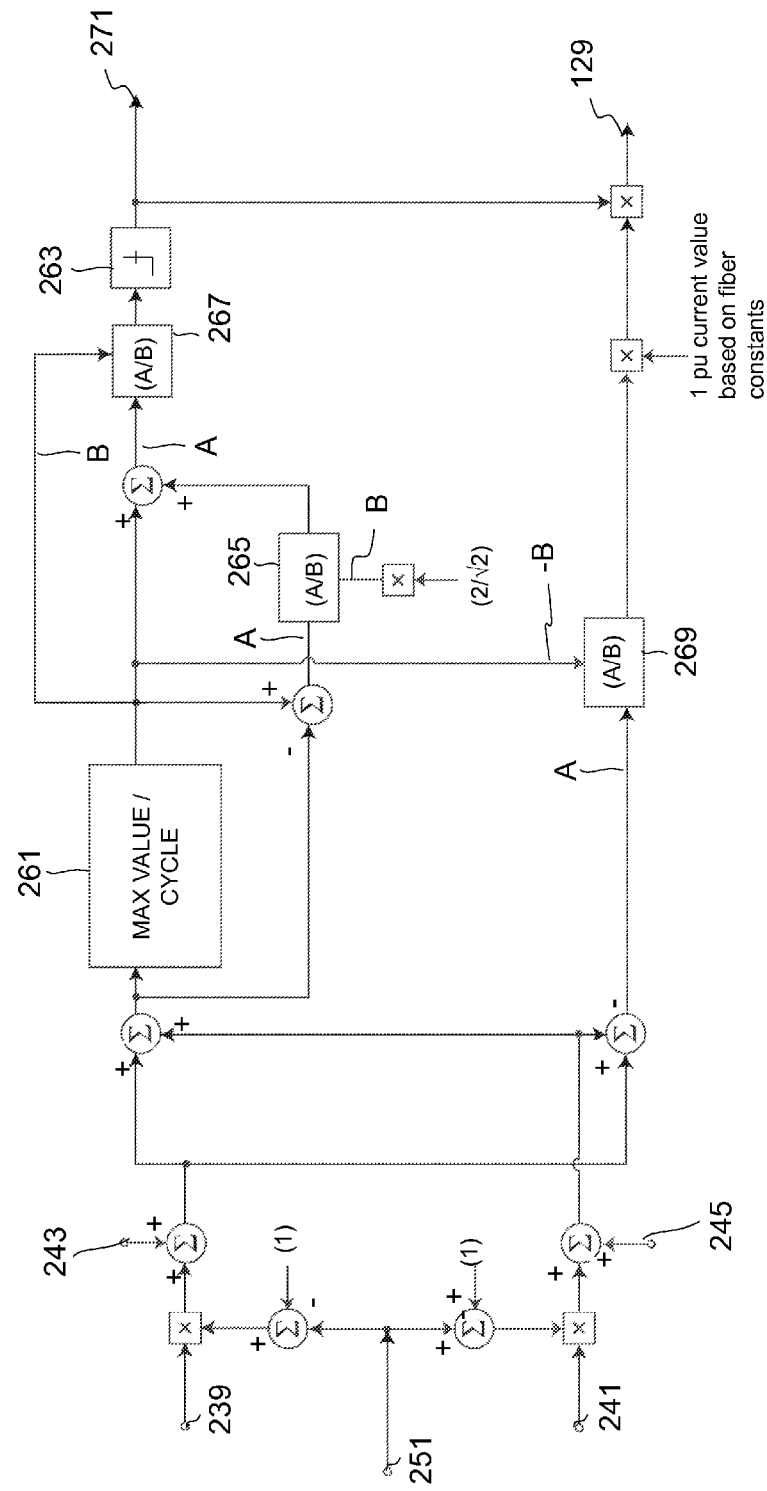
FIG. 2B is an illustration of a sub-system comprised in the exemplary system of FIG. 2A.

FIG. 2A is an illustration of system 200, as discussed above with respect to FIG. 1. It is noted that system 200 can be implemented using discrete integrated circuits such as analog-to-digital (A/D) converters, digital-to-analog (DAC) converters, multiplexers (MUX), amplifiers, integral regulators, push-pull regulators, summing junctions, and the like. System 200 can also be implemented using one or more programmable embedded systems (see FIG. 3). The one or more embedded systems can provide the functionalities that will be discussed below with respect to system 200, FIG. 2A, and FIG. 2B.

System 200 functions as a decoder, in that it decodes information contained in electrical signals X and Y. These signals are representative of the light beams reflected to receiver 101 from fiber 115. System 200 can include a processor (not shown) and a memory (not shown). The processor can be programmed to execute instructions from the memory to control the various components of system 200 shown in FIG. 2A and FIG. 2B. For example, the processor can be programmed to select the gain of the various gain stages of system 200. Signal values can also be stored in the memory to allow further processing and/or data logging. The memory can be co-located with the processor and the other components of system 200.

At power up, system 200 undergoes an initialization and calibration process wherein inherent offsets of DAC modules and A/D modules are cancelled. During initialization and calibration, the gain of gain stage 201 is set to 1 (or to zero, considering the small current input signal), since the gain during operation is normally greater than 10,000. The inherent offset in DAC 221 is determined by taking data at two different gains using gain stage 203. This inherent offset is then removed by offsetting the output of DAC 221 and it is added to any signal inputted to DAC 221. After calibrating DAC 221, the offset of A/D 217 are calculated and stored in the memory. A similar procedure is undertaken using gain stages 209 and 211, DAC 225 and A/D 219.

System 200 includes two signal paths, each reserved for one of electrical signal X and electrical signal Y. Each of these signal paths forms a channel. The path for electrical signal X (hereafter the "X-signal path," or the "X-channel") includes a first gain stage 201 that buffers signals X. Gain stage 201 can be programmed to amplify electrical signal X. When signal X is a current (i.e. a photocurrent in transducer 117), gain stage 201 converts electrical signals X into a voltage signal.

Gain stage 201 is a variable gain stage. During operation of system 200, the processor steps through several gain values supported by gain stage 201 until the output of gain stage 201 reaches an optimum value. For example, the optimum value may correspond to the output of gain stage 201 reaching a voltage that is in the range of about 4 Volts to about 6 Volts. The optimum value can also be a predetermined target voltage and the processor may stop stepping through the gain values of gain stage 201 when the output voltage is within a tolerance of the predetermined target voltage.

The integral regulator 233 forces the output of summing junction 202 to be zero. Thus, the output of integral regulator 233 represents the DC offset contained in electrical signal X. By forcing the output of summing junction 202 to zero, the gain of gain stage 203 (which is also a variable gain stage) can be large without saturating A/D 217.

Similarly, in the path for electrical signal Y (i.e. the "Y-signal path," or the "Y-channel"), there is a gain stage 209 that is a variable gain stage. The processor steps through several gain values supported by gain stage 209 until the output of gain stage 209 reaches an optimum value. As before, the optimum value may correspond to the output of gain stage 209 reaching a voltage that is in the range of about 4 Volts to about 6 Volts. The optimum value can also be a predetermined target voltage and the processor may stop stepping through the gain values of gain stage 209 when the output voltage is within a tolerance of the predetermined target voltage.

The integral regulator 231 forces the output of summing junction 204 to be zero. Thus, the output of integral regulator 231 represents the DC offset contained in electrical signal Y. By forcing the output of summing junction 204 to zero, the gain of gain stage 211 (which is also a variable gain stage) can be large without saturating A/D 219.

System 200 also includes a MUX 207 in the X-signal path. MUX 207 multiplexes several X-channels into driver 205, which drives A/D 217. Inputs of MUX 207 can also include power supply data which can serve to force the output of driver 205 to a power supply rail. In some implementations, MUX 207 can be a 16-to-1 multiplexer.

The output 235 of A/D 217 is fed to the input path of integral regulator 233. A/D 217 can be an 18-bit converter. It is noted that A/D configurations such as flash or sigma-delta or any other A/D architecture can be used without departing from the scope of the present disclosure. Further, Y-signal path includes components similar in architecture and function to the above-mentioned components of the X-signal path. For example, the Y-signal path includes a MUX 213, which can also be used to interface system 200 with multiple Y-signal paths originating from a plurality of FOCTs. Driver 215 drives A/D 219, much like driver 205 drivers A/D 217. The Output 237 of A/D 219 is fed to the input path of integral regulator 231 for further processing. Furthermore, it is noted that A/D 217 and A/D 219 must be synchronized so that the X and Y signals are sampled at the same instance in time. If not then an error occurs, which prevents the two signal from being added or subtracted correctly.

System 200 also includes several components in the input path of the integral regulators 233 and 231. For example, the output signal 235 is scaled by a factor of "−1" and by a factor of "1/G2" before being fed to a summing junction at the input of integral regulator 233. The scaling factor of "−1" is used because A/D drivers 205 and 215 are inverting operational amplifiers. In another embodiment, non-inverting amplifiers can be used to implement drivers 205 and 215, in which the proper scaling factor would be "+1."

The two scaling factors effectively scale the signal of output 235 to provide signal 239, which represents the raw X-signal but in a digital format. Similarly, in the input path of integral regulator 231, output signal 237 is scaled by a factor of "−1" and by a factor of "1/G2" to provide signal 241, which represents the raw Y-signal, which is also in digital format. It is noted that G2 is the gain of stage 203 or that of stage 211. During operation, both stages have identical gains. However, generally speaking, gain stages 203 and 211 do not need to have the same gain, as these gains can be cancelled by adjusting the signal in each path with the reciprocal value of its corresponding gain. Such adjustments mean that outputs 239 and 241 are in engineering units. It is noted that other unit systems can be used without departing from the scope of the present disclosure.

The "n/k" ratio in blocks 247 and 249 in each of the input paths of integral regulators 233 and 231 represent the voltage resolution at which the signal can be observed on each of the input paths. This voltage resolution is governed by the number of quantization levels of A/D 217 and A/D 219. For instance, in blocks 247 and 249, "n" can be 10, indicating a maximum voltage swing of 10 Volts, and "k" can be 131,071, representing the number of quantization levels of 18-bit A/D 217 and A/D 219. It is noted that 10 V corresponds to 131,071 and −10V corresponds −131,071, thereby allowing bipolar operation. Furthermore, it is noted that these values of "n" and "k" are exemplary; they can be changed without departing from the scope of the present disclosure.

System 200 also includes DAC 221 and 225, which convert the outputs of integral regulators 233 and 231 to analog signals before input to summing junctions 204 and 202. The ratios "min" in blocks 227 and 223 merely indicate resolution of the digital-to-analog conversion. For example, "m" can be 32,767, presenting the number of analog levels of either of DAC 221 and DAC 225, and "n" can be 10, indicating a maximum voltage of 10 Volts.

During operation of system 200, the nominal power returned on the Y-signal path is different than the nominal power returned on the X-signal path since different losses can occur in each of the channels. These losses correspond to a gain of less than 1. As such, push-pull regulator 229 is configured to adjust the gain in both the X-signal path and the Y-signal path to force each of electrical signal X and electrical signal Y to be on the same per-unit basis. This occurs via the summing junctions 242 and 244 and by scaling the outputs of integral regulators 233 and 231. This compensates for losses due to temperature variations, crystal offsets and other losses found in the optical components.

Once push-pull regulator 229 has corrected the gain, electrical signal Y can then be subtracted from the electrical signal X, and any DC component will be eliminated. Signals 243 and 245 correspond respectively to the DC offset in electrical signal X and electrical signal Y, respectively. Push-pull regulator 229 ensures that offset removal can still be performed when there is a sudden change in the output power of light source 107. This is important since, in some implementations, integral regulators 233 and 231 may be relatively slow in forcing the outputs of summing junctions 202 and 204 to zero. Thus, as a result of the operation of push-pull regulator 229, any AC component that would appear in the measured current due to distortions will be removed.

System 200 can be configured to provide accurate current measurements in a low current regime and in a high current regime. For instance, when the X and Y signals are added to obtain the measured current, their AC component is cancelled and only the DC component remains. This occurs when the current in conductor 113 is in the low current regime, i.e. below approximately 4,000 A (rms).

In the high current regime (i.e. for a current in conductor 113 that is greater than 4,000 A (rms)), the area of the negative section of the AC waveform in the measured current is greater than the area of in its positive section. The difference between these two areas grows with larger currents. As such, during large current measurements, the DC signal will be dominated by the negative portion of the current, and will have a fundamental frequency twice that of the waveform in the negative section.

Thus, if the DC signal is low pass filtered, the output will decay with large current measurements. This decay corresponds to a perceived decrease in steady state light power. System 200 can be configured to detect a maximum value in each cycle required to capture the true power value of the light source. This occurs using the ratio of the maximum value to the perceived power value as a current correction factor. This eliminates the non-linear error to 1 pu current, i.e. to the level of current that causes a 45 degree change in the steady state value. A sub-system 260 of system 200 that can achieve these function is described below, with respect to FIG. 2A.

Sub-system 260 (FIG. 2B) makes use of the extracted DC offset from the X signal (signal 243), the extracted DC offset from the Y signal (signal 245), the output of the push-pull regulator 229 (i.e. signal 251), the raw X signal 239, and the raw Y signal 241. The raw signals are multiplied by output 251 to place the signals on the same per unit base, then they are combined with their corresponding DC offset. The resulting composite signal is then fed to block 261 which is configured to detect a maximum in the current cycle of the composite signal. When the signals are on the same per unit base they can be added or subtracted. When the signals are added, the AC portion of the signal is cancelled. When the signals are subtracted, the DC component is eliminated. One of skill in the relevant art(s) will readily recognize common means for dynamically detecting maximum values (on a per cycle basis) from a signal can be used to implement block 261. For example, a peak detector can be used to implement block 261.

Once the maximum value in the current cycle is detected, the composite signal is corrected with a correction factor 271 computed by sub-system 260. The computation is achieved using a plurality of summing junctions, multiplying junctions, and division junctions (267, 265, 269), and with a maximum value selector 263 (with a minimum value of 1 and the input). The DC power is scaled by a factor of 2 going into division junction 265. The corrected output current 129 (also shown in FIG. 1) is a high-fidelity measurement of the current induced in conductor 113.

Figure 3:
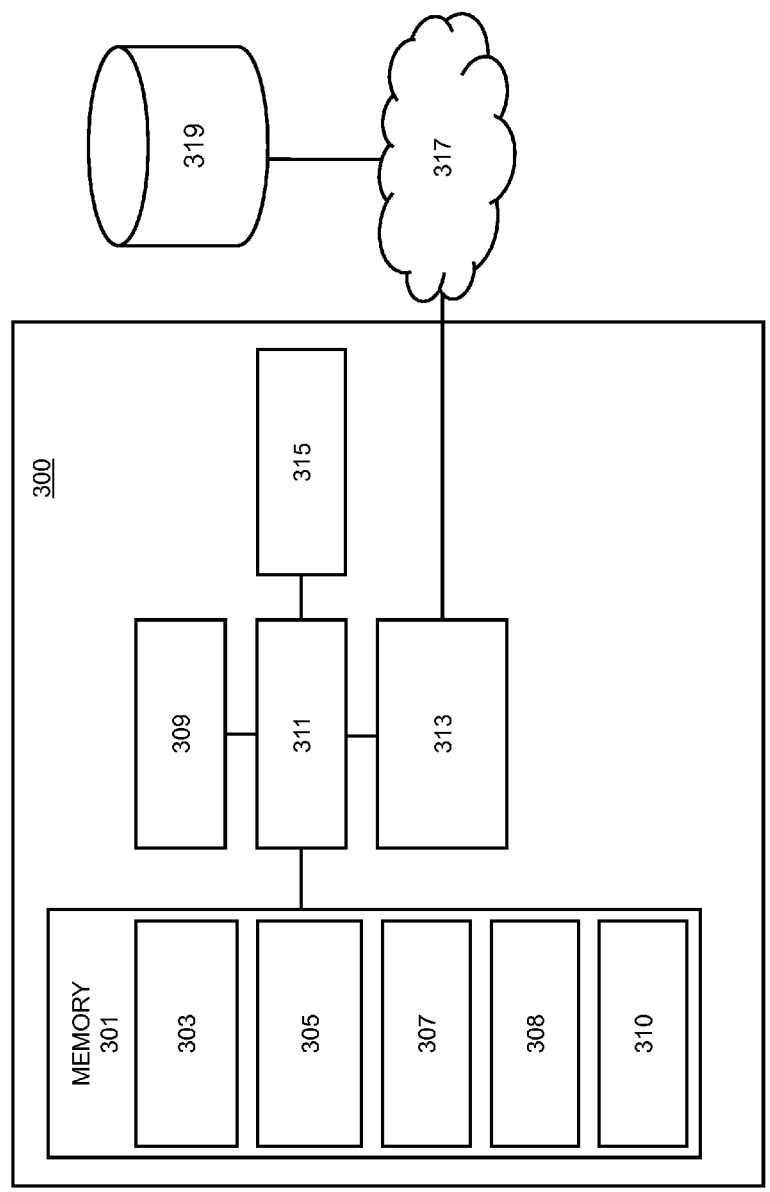
FIG. 3 is an illustration of another system, according to an exemplary embodiment.

FIG. 3 is an illustration of system 300 according to an embodiment. System 300 can perform all the functions described above with respect to system 200. Furthermore, system 300 is an application-specific system implemented using programmable hardware. The functions of system 300 can be programmed in software and/or firmware that can be loaded onto a computer-readable medium which can be read by system 300 to cause system 300 to execute one or more of the functions.

System 300 can be implemented using at least one of a system-on-a-chip (SoC), an embedded computer, and a microcontroller. System 300 can include a processing unit coupled to a memory device. The memory can have instructions stored thereon, the instructions being configured to cause the processing unit to execute the various functions described above with respect to system 200.

System 300 can include one or more hardware and/or software (or firmware) components configured to fetch, decode, execute, store, analyze, distribute, evaluate, and/or categorize information relating to the various functions and applications discussed herein. In some embodiments, the entirety of system 300 may be located proximate to the transmission line (i.e. conductor 113 in FIG. 1). In other embodiments, some components of system 300 may be located distant from the transmission line, i.e. away from the measurement site.

System 300 can include one or more processing unit 311, a storage device 315, a memory 301, an input/output (I/O) module 309, and a communication network interface 313. System 300 can be connected to a communication network 317 via network interface 313. As such, system 300 can be communicatively coupled to a database 319. While FIG. 3 illustrates only one database (database 319), one of ordinary skill in the relevant art(s) will readily recognize that system 300 may be communicatively coupled to several databases.

System 300 can be configured to function as a client device that is communicatively coupled to a server (not shown) via network 40. The server may be located at one data center, or distributed over a plurality of data centers. In some embodiments, I/O module 309 includes a keypad for user input. In other embodiments, I/O module 309 can include a touchscreen interface for input and one or more displays for visual output, such as a view screen.

Processing unit 311 can include one or more processing devices or cores (not shown). Further, as shown in FIG. 3, processing unit 311 can be communicatively coupled to storage device 315, memory 301, I/O module 309, and network interface 313. As such, processing unit 311 may be configured to execute software or firmware instructions, routines, or sub-routines that are designed to cause processing unit 311 to perform a variety of functions and/or operations consistent with the embodiments of the present disclosure. In one exemplary embodiment, instructions can be loaded into the various modules of memory 301 for execution by processing unit 311. Instructions can also be fetched by processing unit 311 from database 319, storage device 315, or they may be provided to processing unit 311 from I/O module 309.

Storage device 315 can include a volatile or non-volatile, magnetic, semiconductor, tape, optical, removable, non-removable, read-only, random-access, or other type of storage device or computer-readable computer medium. Furthermore, storage 315 can be configured to log data processed, recorded, or collected during the operation of system 300. The data can be time-stamped, cataloged, indexed, or organized in a variety of ways consistent with data storage practice without departing from the scope of the present disclosure.

Communication network interface 313 includes one or more components configured to transmit and receive data via communication network 317. These components can include one or more modulators, demodulators, multiplexers, de-multiplexers, network communication devices, wireless devices, antennas, modems, and any other type of device configured to enable data communication via any suitable communication network. Furthermore, communication network 317 can be any appropriate network allowing communication between or among one or more computing systems, such as the Internet, a local area network, or a wide area network.

Memory 301 can include an initialization and calibration module 303 configured to cause processing unit 311 to initialize and calibrate system 300, as described above with respect to system 200. Further, memory 301 can include an X-offset removal module 305 configured to cause processing unit 311 to receive an electrical signal X from one transducer (not shown) and to remove an offset from the electrical signal X. Furthermore, memory 301 can include a Y-offset removal module 307 configured to cause processing unit 311 to receive an electrical signal Y from another transducer (not shown) and to remove an offset from the electrical signal Y.

Memory 301 can also include a normalizing module 308 configured to normalize electrical signal Y and electrical signal X, wherein normalization includes making electrical signal X and electrical signal Y to be on the same per unit basis. In sum, while only a few modules are described in relation to memory 301, it should be understood that all of the functions of system 200 can be implemented in the form of modules of memory 301. Moreover, memory 301 can include a linearizing module 310 that is configured to correct non-linearities in the output current as described with respect to sub-system 260.

Having set forth the structure and function of system 200 and the various modules included in exemplary system 200, operations consistent with embodiments of the present disclosure are now described. Such operations can include executing a method of removing a DC offset using the exemplary systems previously described.

FIG. 4 is a flow chart illustrating a method 400, according to an embodiment. Method 400 can be executed using the exemplary systems described above. Further, it may be used to remove offsets in electrical signals as well adjusting one or more electrical signals to be on the same per unit basis. It is noted that while method 400 is discussed in the context of electrical signals transduced from FOCT light signals, method 400 is not limited to only such applications. Specifically, method 400 can be used for any application in which offset removal and signal normalizing is required.

Method 400 includes receiving, by a system like the ones disclosed herein, a first light signal. Further, method 400 includes transducing the first light signal into a first electrical signal, which can be the X-signal, as described above (401). Method 400 also includes receiving a second light signal and transducing the second light signal into a second electrical signal, which can be the Y-signal, as described above (401).

Method 400 then includes adjusting the first electrical signal and the second electrical signal until both electrical signals are on the same per unit basis (403). Furthermore, method 400 can also include removing offsets present in each of the adjusted first electrical signal and second electrical signal (405).

In some embodiments, method 400 can include monitoring a difference in DC offsets between the first electrical signal and the second electrical signal (407). Moreover, as a result of monitoring the DC offsets, method 400 can include altering the first electrical signal and the second electrical signal until both signals are equal. Adjusting the electrical signals may include altering the first electrical signal and the second electrical signal by providing a gain to multiply each of the signals until both are equal. Furthermore, adjusting the signals can include normalizing the first electrical signal and the second electrical.

Method 400 can also combining the first electrical signal and the second electrical signal into a composite signal that is offset free (409). Furthermore, memory 301 can include linearizing the composite signal (411) and subsequently producing a high-fidelity output of the current induced in a conductor proximate to the FOCT based on the linearized composite signal (413).

Those skilled in the relevant art(s) will appreciate that various adaptations and modifications of the embodiments described above can be configured without departing from the scope and spirit of the disclosure. Therefore, it is to be understood that, within the scope of the appended claims, the disclosure may be practiced other than as specifically described herein.

What is claimed is:

1. A system, for use with a fiber-optic current transducer (FOCT), the system comprising:
    a processing unit configured to:
        transduce a first light signal into a first electrical signal;
        transduce a second light signal into a second electrical signal;
        calculate a first direct current (DC) offset of the first electrical signal;
        calculate a second direct current (DC) offset of the second electrical signal;
        calculate a difference value by subtracting the first DC offset of the first electrical signal from the second DC offset of the second electrical signal;
        calculate, based on the difference value, a first gain for the first electrical signal and a second gain for the second electrical signal;
        calculate a first adjusted DC offset by multiplying the first DC offset by the first gain;
        calculate a second adjusted DC offset by multiplying the second DC offset by the second gain;
        wherein the first gain and the second gain are determined such that the first adjusted DC offset is equal to the second adjusted DC offset;
        calculate a first adjusted electrical signal by multiplying the first electrical signal by the by the first gain;
        calculate a second adjusted electrical signal by multiplying the second electrical signal by the second gain;
        calculate a current output signal based on subtracting the first adjusted electrical signal from the second adjusted electrical signal;
        calculate a current correction factor by:
            adding the first adjusted electrical signal and the second adjusted electrical signal to form a composite signal;
            detecting a maximum value of a cycle the composite signal; and calculating the current correction factor based on a ratio of the composite signal to the maximum value; and calculate a corrected current output signal by multiplying the current output signal by the current correction factor.

2. The system of claim 1, wherein the current correction factor is calculated if the current output signal is above a threshold of 4000 Amperes.

3. The system of claim 1, wherein the first light signal and the second light signal are provided by light in a fiber that is reflected via a first path and a second path.

4. The system of claim 3, wherein the fiber is positioned around a conductor.

5. The system of claim 1, further comprising a crystal in the FOCT, the crystal configured to route the first light signal and the second light signal.

6. The system of claim 1, wherein the first DC offset is determined by integrating the first electrical signal with an integrator and the second DC offset is determined by integrating the second electrical signal with the integrator.

7. The system of claim 1, wherein the first DC offset is provided to a first summing junction to remove the first DC offset from the first electrical signal and the second DC offset is provided to a second summing junction to remove the second DC offset from the second electrical signal.

* * * * *